United States Patent [19]
Pokar et al.

[11] 4,039,828
[45] Aug. 2, 1977

[54] QUADRUPOLE MASS SPECTROMETER

[75] Inventors: Jochen Pokar, Julich; Horst Pütter, Aachen, both of Germany

[73] Assignee: URANIT Uran-Isotopentrennungs-GmbH, Julich, Germany

[21] Appl. No.: 532,364

[22] Filed: Dec. 13, 1974

[30] Foreign Application Priority Data

Dec. 13, 1973 Germany ............................ 2361955

[51] Int. Cl.[2] ............................................ H01J 37/08

[52] U.S. Cl. .................................... 250/288; 250/292; 250/427

[58] Field of Search ............... 250/281, 282, 283, 288, 250/292, 423, 424, 425, 426, 427

[56] References Cited

U.S. PATENT DOCUMENTS

| | | | |
|---|---|---|---|
| 3,142,752 | 7/1964 | Hamer | 250/425 |
| 3,313,935 | 4/1967 | Bell | 250/425 |
| 3,418,513 | 12/1968 | Elliott | 250/288 |
| 3,553,451 | 1/1971 | Uthe | 250/292 |
| 3,770,954 | 11/1973 | Davis | 250/288 |

OTHER PUBLICATIONS

"A New Mass Spectrometer for Precision Measurement of the $^{235}U$ $^{238}U$ Ratio of $UF_6$, " Brannee, Advances in Mass Spectrometry, vol. 2, Pergamon Press, 1962.

*Primary Examiner*—Craig E. Church
*Attorney, Agent, or Firm*—Spencer & Kaye

[57] ABSTRACT

In a quadrupole mass spectrometer enclosed by a high vacuum container and including an ionization chamber, a molecular beam radiator passing through the container and having an output opening for supplying the gas to be analyzed, and a cryopump arranged for receiving the molecular beam exiting from the output opening and serving as a radiation trap, the output opening of the radiator and the cryopump are disposed at the periphery of the ionization chamber preferably diametrically opposite one another.

8 Claims, 1 Drawing Figure

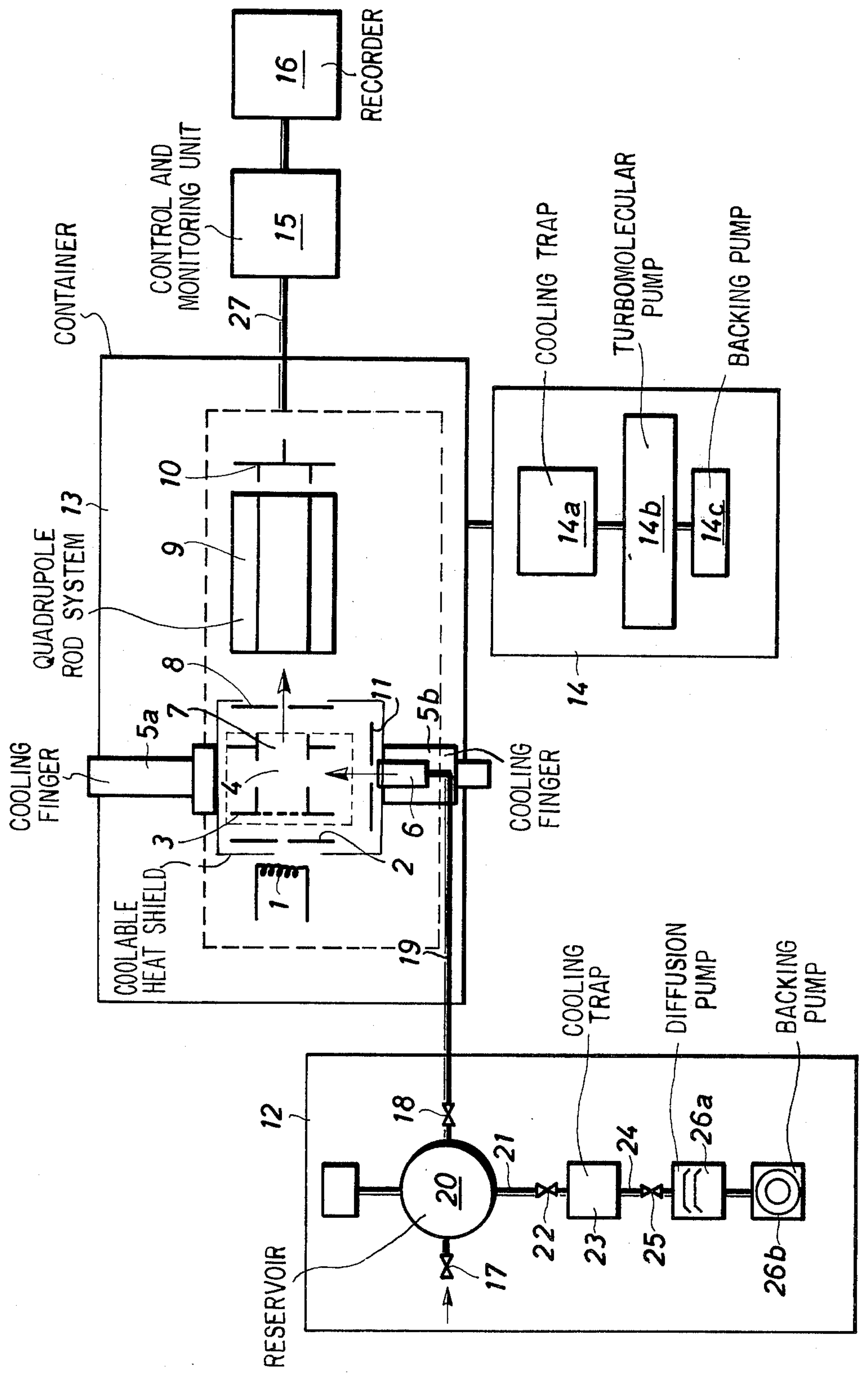
RECORDER
16
15
CONTROL AND MONITORING UNIT
27
CONTAINER
QUADRUPOLE ROD SYSTEM
13
10
9
8
7
11
5a
5b
4
3
2
1
6
COOLING FINGER
COOLING FINGER
COOLABLE HEAT SHIELD
19
COOLING TRAP
TURBOMOLECULAR PUMP
BACKING PUMP
14a
14b
14c
14
12
18
20
21
22
23
24
25
26a
26b
17
RESERVOIR
COOLING TRAP
DIFFUSION PUMP
BACKING PUMP

QUADRUPOLE MASS SPECTROMETER

BACKGROUND OF THE INVENTION

The present invention relates to a quadrupole mass spectrometer of the type which is enclosed in a high vacuum receptacle.

In known quadrupole devices, which were developed for residual gas analyses and as disclosed in the periodical VacuumTechnik, Volume 20, 1971, Issue No. 3, pages 65–71, gas to be analyzed diffusely enters into an ionization chamber. However, with corrosive gases which tend to sublimate, this leads to unstable output signals after a short period of operation.

SUMMARY OF THE INVENTION

It is an object of the present invention to enable a quadrupole mass spectrometer to analyze corrosive gases or gases tending to sublimate while producing a stable and reproduceable signal over longer measuring periods.

This and other objects according to the present invention are achieved by disposing at the periphery of the ionization chamber the opening of a molecular radiator which passes through the receptacle and introduces the gas to be analyzed, and a cryopump which is associated to the molecular beam exiting from the opening and serves as the beam trap. The molecular radiator and the cryopump are disposed diametrically opposite one another so that the molecular beam which passes through the ionization chamber is approximately perpendicular to the major axis of the quadrupole rod system. In order to collimate the molecular beam, an aperture is disposed between the opening of the radiator and the ionization chamber. A further cryopump is associated with the aperture so as to enclose the molecular beam radiator and collect the portion of the molecular beam which has not passed through the aperture.

Thus it is accomplished that the structural elements which constitute the ion generation system, or ion source, are not influenced by the heat radiation of the hot cathode and can be kept at a defined low temperatue, e.g. between room temperature and $-100°$ C, thereby preventing corrosion and deposition which would lead to signal instabilities and which are possible as a result of interactions between the diffused corrosive gas molecules and the ion source components in question at higher temperatures, of more than $+50°$ C. Thus it is possible to perform with this instrument, for example, an isotope analysis of uranium hexafluoride ($UF_6$) over longer periods of dwell.

BRIEF DESCRIPTION OF THE DRAWING

The single FIGURE is a schematic representation of a mass analyzer system incorporating one perferred embodiment of the invention.

DESCRIPTION OF THE PREFERRED EMBODIMENT

The arrangement shown in the FIGURE includes the spectrometer itself which is composed of a cathode 1, a Wehnelt cylinder 2, a grid 3, the ionization chamber 4, the oppositely disposed cryopumps, or cooling fingers **5*a* and 5*b*, the molecular beam generator 6, which is enclosed by cooling finger 5*b*, the ion optical region 7, the entrance aperture 8, the quadrupole rod system 9, the ion trap, or Faraday beaker 10, and a molecular beam aperture 11. The actual measuring unit, enclosed in a broken line box, is installed in a high vacuum container 13 as an "immersed" system. The total system further includes a gas inlet system 12, a high vacuum (HV) generating system 14 connected to the container 13, and a control and monitoring unit 15 with associated recording means 16** for processing and evaluating the measured signal.

The gas to be analyzed is introduced through inlet valve 17 into a large-volume sample reservoir 20. From there it is conducted via a valve 18 and an inlet line 19 into the molecular beam generator 6. The molecular beam emanating from the opening of the molecular beam generator 6 is collimated by the aperture 11 and penetrates the ionization region 4 in which a part of the gas molecules are being ionized. The thus formed ions are accelerated through the ion optical region 7 in the direction toward the entrance aperture 8. The ions entering the rod system are filtered by the quadrupole system existing between the rods so that only ions with a certain charge-related mass reach the trap 10. With the appropriate setting of the direct and alternating voltages applied to the rods it is possible to determine, for example, the isotope composition of a gas.

In order to analyze uranium isotopes, $UF_6$ is introduced into the highly evacuated storage vessel 20 until the gas pressure has risen to about 0.3 Torr. The container 13 is held at a pressure of $p<10^{-6}$ Torr with the aid of an $LN_2$ (liquid nitrogen) cooling trap **14*a*, a series-connected turbomolecular pump 14*b* and a backing pump 14*c*. The volume of the storage vessel 20 is kept large enough that its pressure drops only unnoticeably during the measurement, i.e. the time during which a portion of the gas passes through the ionization chamber 4 in the form of a molecular beam. After the measurement, the gas which is no longer required is frozen out through a line 21 and a valve 22 into an $LN_2$ cooling trap. 23. After opening the valve 22 the $UF_6$ gas will flow into the trap 23** and desublime there on the $LN_2$ cooled surface corresponding to the phase diagram of $UF_6$ at $-196°$ C.

The cooling trap 23 is connected, via a line 24 and a valve 25, to a diffusion pump **26*a* with a backing pump 26*b*, in order to be able to evacuate the storage vessel 20** to a residual gas pressure of $<10^{-4}$Torr.

The molecules of the molecular beam which have been cut out by aperture 11 are frozen out at the $LN_2$ cooling finger **5*b*. The part of the molecular beam not utilized for the ionization or for the measurement, respectively, is frozen out at the $LN_2$ cooling finger 5*a*.**

In order to avoid field distortions, at least the opening of the molecular beam radiator 6 is kept at the same electrical potential as the parts of the ion source which border the ionization region 4. An electrical connection between the radiator tip 6 and the grid 3 brings both elements to the same electrical potential thus avoiding undefined chargings of the radiator and distortions of the ion optical potentials. In addition, a coolable heat shield is disposed between cathode 1 and ionization chamber 4, the heat shield being kept at a low temperature level by connecting it with the cooling fingers **5*a* and 5*b*.**

The radiator itself is made of an $UF_6$ resistant material, e.g. polytrifluorochloroethylene, polytetrafluoroethylene or aluminum oxide, which is provided with an electrically conductive coating in the region of the radiator opening.

Furthermore, the molecular beam radiator can be adjusted externally via a threaded passage (not shown)

with respect to its position relative to the ion source. This makes it possible to adjust the molecular beam radiator so that optimum conditions will exist for the $UF_6$ molecules to be bombarded into the ionization chamber.

In the present case, the $UF_5^+$ ions are used for the isotope analysis with the masses M = 330 for U 235 and M = 333 for U 238.

All electrical channels required for operation and measurements are accommodated in the terminal section 27 which has the shape of a flange-type insert. The supply voltages for the ion source, the high frequency voltage and the direct voltage for the rod system, the voltage for the mass passage control and for the main amplifier as well as the supply voltage for the electrometer amplifier, which is disposed directly at the measuring system, are furnished by the control and monitoring unit 15.

The ion beam signals for U 235 and U 238 emitted by the ion trap at successive moments can either be received, after suitable amplification, by the compensation recorder 16 and will then be divided or they can be divided and printed out by commercially available electronic components.

An arrangement consisting of a molecular beam together with cooling fingers as disclosed in Advances in Mass Spectrometry, Volume 2, Pergamon Press, 1962, has contributed to an embodiment of the present invention.

It will be understood that the above description of the present invention is susceptible to various modifications, changes and adaptations, and the same are intended to be comprehended within the meaning and range of equivalents of the appended claims.

We claim:

1. In a quadrupole mass spectrometer enclosed by a high vacuum container and including an ionization chamber enclosing an ionization region in which gas molecules are ionized, an ion source located outside of the ionization chamber and separated from the ionization region, a molecular beam radiator passing through the container and having an output opening for supplying the gas to be ionized in the ionization region and to be analyzed, and a cryopump arranged for receiving the molecular beam exiting from the output opening and serving as a radiation trap, the improvement wherein said output opening of said radiator and said cryopump are disposed at the periphery of said ionization chamber and said cryopump is located in line with the molecular beam exiting from said output opening, and said spectrometer further comprises a second cryopump enclosing said molecular beam radiator, a cathode, and a coolable heat shield between said cathode and said ionization chamber and kept at a low temperature level by connecting it with said cryopumps.

2. A system as defined in claim 1 wherein said molecular beam radiator and the said cryopump are disposed diametrically opposite one another, and the longitudinal axis of said molecular beam radiator is approximately perpendicular to the longitudinal axis of the quadrupole rod system of said spectrometer.

3. A system as defined in claim 2 further comprising means defining a molecular beam aperture disposed between said molecular beam radiator and said ionization chamber.

4. A system as defined in claim 1 further comprising means maintaining said output opening of said molecular beam radiator at the same electrical potential as the portions of said system which border said ionization chamber.

5. A system as defined in claim 4 wherein said radiator is made of a plastic material which is resistant to the medium to be analyzed or of a ceramic material, and said output opening is provided with an electrically conductive layer.

6. A system as defined in claim 5 wherein said radiator is made of plastic material selected from the group consisting of polytrifluorochloroethylene and polytetrafluoroethylene.

7. A system as defined in claim 5 wherein said radiator is made of aluminum oxide.

8. A system as defined in claim 5 wherein said molecular beam radiator is fastened to said container to be adjustable in its position with respect to said ionization chamber.

* * * * *